(12) United States Patent
Steinich

(10) Patent No.: US 8,288,666 B2
(45) Date of Patent: Oct. 16, 2012

(54) ENCASEMENT TECHNIQUE FOR ELECTRONIC CIRCUITS

(75) Inventor: Klaus Manfred Steinich, Zorneding/Poring (DE)

(73) Assignee: ASM Automation Sensorik Messtechnik GmbH, Moosinning (DE)

( * ) Notice: Subject to any disclaimer, the term of this patent is extended or adjusted under 35 U.S.C. 154(b) by 392 days.

(21) Appl. No.: 12/462,881

(22) Filed: Aug. 11, 2009

(65) Prior Publication Data

US 2010/0039756 A1 Feb. 18, 2010

(30) Foreign Application Priority Data

Aug. 14, 2008 (DE) .......................... 10 2008 037 667

(51) Int. Cl.
*H01L 23/48* (2006.01)

(52) U.S. Cl. ....................................... 174/527; 174/521

(58) Field of Classification Search ................... 174/521, 174/564, 524, 527
See application file for complete search history.

(56) References Cited

U.S. PATENT DOCUMENTS

| 4,792,879 | A | * | 12/1988 | Bauknecht et al. | ........... 361/816 |
| 6,118,072 | A | * | 9/2000 | Scott | .............................. 174/525 |
| 6,612,168 | B2 | * | 9/2003 | Barr et al. | ................... 73/290 V |
| 2003/0150634 | A1 | * | 8/2003 | Jakob et al. | ................... 174/520 |

* cited by examiner

*Primary Examiner* — Hung Ngo
(74) *Attorney, Agent, or Firm* — Head, Johnson & Kachigian, P.C.

(57) ABSTRACT

In order not to damage encased circuits under temperature expansion, they are encased in an external encasement mold, wherein the encasement body thus created comprises singular or line shaped rises on its exterior surface, and is supported at said rises after insertion into the external housing. The free spaces then remaining between the encasement body and the housing are available for expansion.

11 Claims, 7 Drawing Sheets

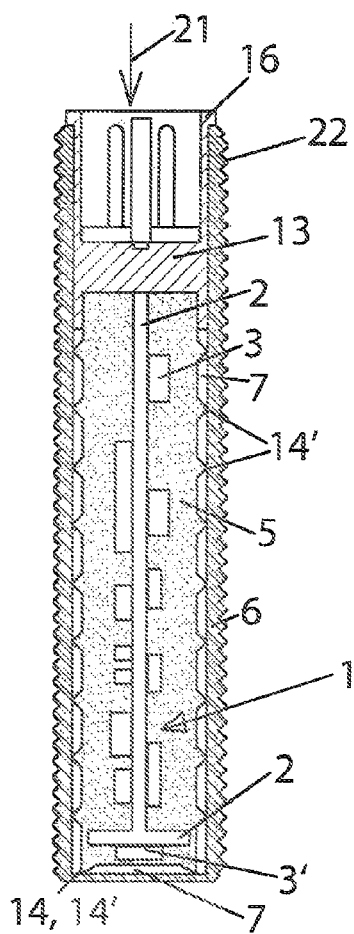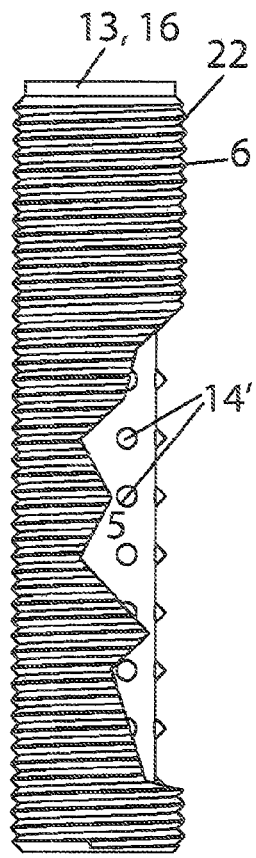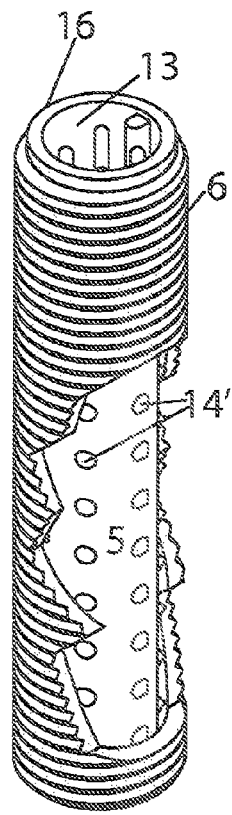
Fig. 2a    Fig. 2b    Fig. 2c
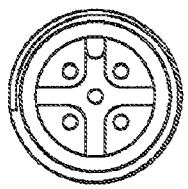
Fig. 2d

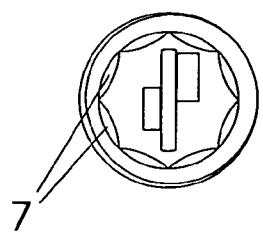
Fig. 5a
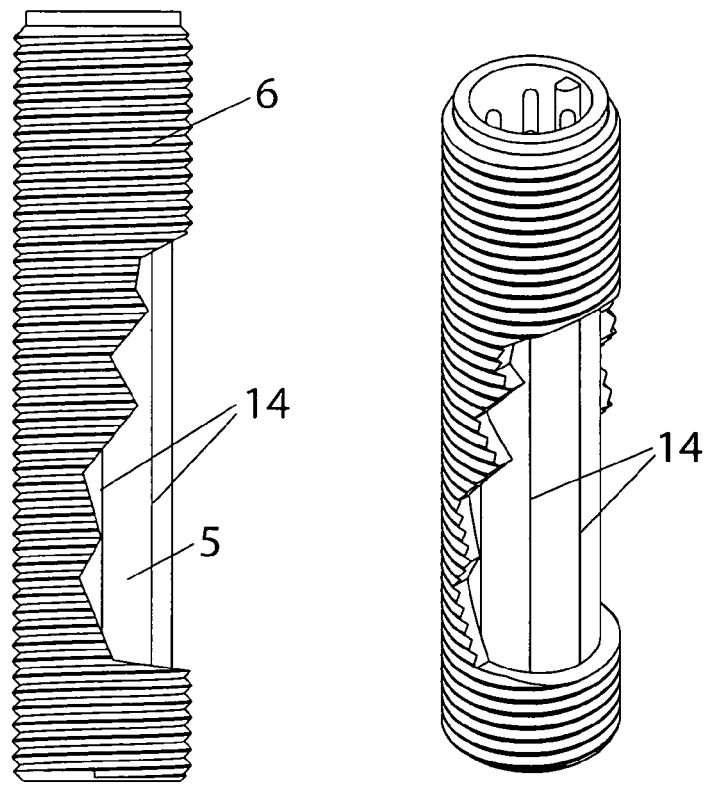
Fig. 5b
Fig. 5c

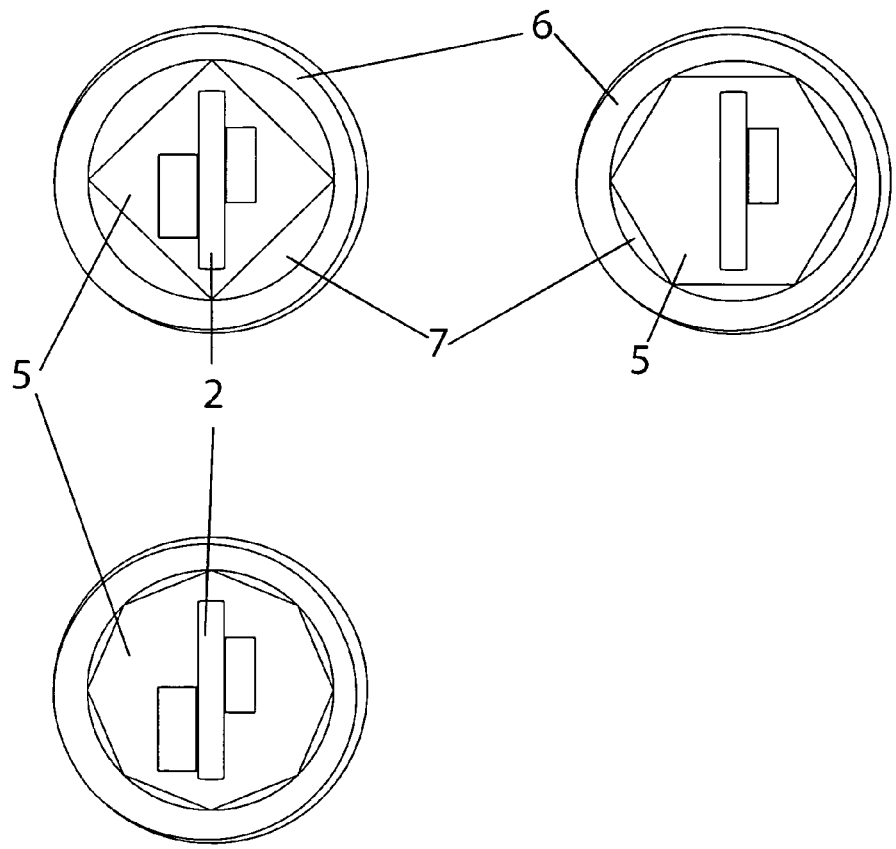

ENCASEMENT TECHNIQUE FOR ELECTRONIC CIRCUITS

CROSS-REFERENCE TO RELATED APPLICATIONS

This United States application claims priority to German Patent Application No. 10 2008 037 667.1 filed 14 Aug. 2008 which is incorporated herein by reference.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

I. Field of the Invention

The invention relates to encased electronic circuits, in particular for electronic circuits of sensors.

Electronic circuits, which typically have to be well protected from environmental impacts due to their subsequent application in harsh environments, are often circumferentially encased with plastic material, which plastic material often is a hardening plastic material.

Since said encasement plastic material mostly only has limited mechanical stability, mostly a mechanically more stable outer housing is disposed, which is comprised of metal or of a hard plastic material.

In order to simplify production, the encasement is thus performed directly in the outer housing as an encasement mold.

Thus, however, it has become apparent that in this case damaging the electronic components often comes as a consequence, in particular when the circuit is exposed to temperature variations.

BRIEF SUMMARY OF THE INVENTION

Thus, it is the object of the invention to provide a configuration of an electronic circuit and a method for its production, which does not comprise said disadvantage of the prior art, in spite of allowing simple production.

By providing free spaces between the encasement body and the outer housing, the encasement body can expand due to temperature, which reduces said free spaces without the expanding encasement body immediately pressing against the outer, stable less co-expanding housing, thus creating stress in the interior of the encasement body, which also acts upon the electronic components encased therein and damages them or tears them off from the circuit board.

Through the form locked contact of the encasement body at the inner surfaces of the housing, which contact is still provided, e.g. through line shaped or singular protrusions on the outer circumference of the encasement body, said encasement body is sufficiently stable and received in the interior of the housing in a form locked manner.

Since expansions of the encasement body can also occur through other environmental impacts, like e.g. increased humidity, etc., typically, however, through temperature variations, either through the environment or through the operation of the electronic circuit itself, in particular when the free spaces are small, thus when the outer housing has to be sized as small as possible with respect to its outer dimensions, the expansion properties of the materials are also important.

The material of the outer housing should then not expand substantially less over a temperature increase, than the material of the encasement body, but if possible, it should expand to the same extent. The material of the encasement body should have expansion properties, which are similar to expansion properties of the circuit board in the predetermined temperature range in order not to induce tensions between the encasement body and the circuit board due to encasement material having a significantly higher or significantly lower expansion than the circuit board.

Since the free spaces extend if possible along all exterior surfaces of the encasement body, and if possible along their entire length, it is being avoided that impermissibly high tensions are imparted upon the circuit by the housing through the expansion of the encasement body.

Since the expansion in longitudinal direction is the largest expansion in absolute values in case of a long slender encasement body, a distance is maintained in particular between the faces of the encasement body, which are in front in insertion direction, and the opposite surface of the housing, by either having no motion at all between the two surfaces, or a contact is established e.g. only along few rises on the face of the encasement body, e.g. along the externally circumferential edge of the encasement body, which can also be an annular circumferential rise.

In the center portion of the face, however, an offset should be provided, in particular when an electronic component, like e.g. a chip disposed transversally to the longitudinal axis, is positioned there.

This can be accomplished e.g. by inserting the encasement body in longitudinal direction until a shoulder provided at the rear end of the encasement body contacts the open face of the housing or the rises on the other face of the encasement body cited supra.

In order to position the circuit board in a simple manner during encasement in the encasement body, while still encasing the circuit itself completely enveloped, the circuit board contacts said encasement mold only with few outward protruding protrusions in its main plane, which protrusions in particular mate with respective receivers of the encasement mold, while the remainder of the circuit board and thus also the entire circuit itself, which is stored thereon, is recessed there from, thus assuming an offset from the encasement mold and being completely enveloped by the subsequent encasement body.

During encasement of the circuit board, the subsequent housing cover for the outer housing can be co-inserted as a closure of the encasement mold and can be integrally cast with the encasement body on one side, so that the subsequent insertion of the encasement body into the housing simultaneously places the cover onto the housing in a single process step.

The encasement material, which is typically plastic, can be a light permeable, in particular a light permeably colored plastic, and thus at least over a portion of the encasement body.

Thus, it can be accomplished that optical elements included in the encased circuit, like e.g. photodiodes or light emitting diodes are visible from the outside or receive light from the outside, when the housing subsequently also comprises at least transparent portions shaped as a window.

For this purpose, the encasement mold can also be filled with different encasement materials, section by section, e.g. also with differently colored transparent encasement materials.

In order to reduce the tensions transferred onto the electronic components, the encasement can also be performed in several layers, in particular with encasement materials of different hardness when hardened, so that an encasement is performed in a first casting step with a material which does not harden completely and remains relatively elastic, and in a second step, said material is encased by a material which hardens to a higher strength.

In order to run the signals from the electronic circuit through cables to the outside, a cable is already run out through the housing cover during encasement, wherein in a preferred embodiment, the cable is screwed with its cable jacket through the inner thread of the pass-through in the housing cover, which inner thread has a dimension, so it digs into the cable jacket, thus providing pull relief in longitudinal direction from the cover onto the cable jacket and from there onto the cable. This is performed before connecting the conductors of the cable with the electronic circuit and before the subsequent encasement of the circuit and of the cable running through the housing cover in the encasement mold.

Disposing a plug connector in the cover is another option, where the contacts of the plug connector are connected with the electronic circuit before encasement, and which plug connector is preferably integrally connected through casting on one side, like the housing cover.

In order to seal the encasement body relative to the housing, an annular circumferential groove is left open in the outer circumference of the encasement body or of the plug connector, which constitutes the front end of the encasement body, or of the housing cover, which is performed in particular through casting when the encasement body is produced, and an O-ring is inserted into said groove before inserting into the surrounding housing, and the O/ring is possibly applied to the outer circumference of the encasement body between the O-ring and the outward protruding shoulder of the insertion component, if such insertion component is provided.

BRIEF DESCRIPTION OF THE DRAWINGS

Embodiments of the invention are subsequently described in more detail with reference to drawing figures, wherein:

FIGS. 2(*a*)-(*d*) show a first embodiment of the encased component;

FIGS. 5(*a*)-(*c*) show a fourth embodiment of the encased component;

FIGS. 6(*a*)-(*c*) show different cross sectional shapes of the encasement body.

DETAILED DESCRIPTION OF THE INVENTION

Figure 1:
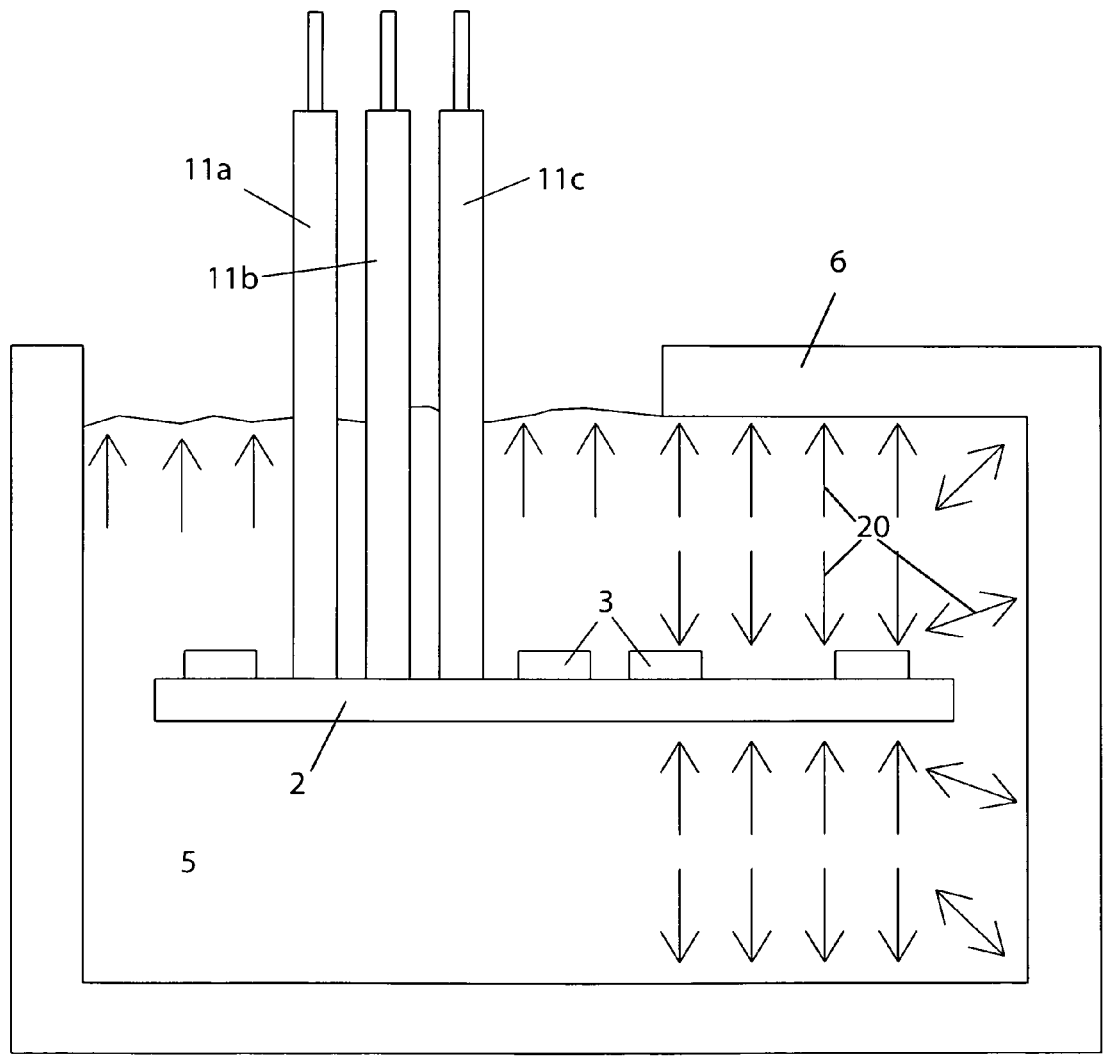
FIG. 1 shows the configuration in the prior art.

FIG. 1 shows the configuration in the prior art, when an electronic circuit 3 disposed on a circuit board 2 is inserted into the subsequent housing 6 and completely encased directly therein, so that the encasement body 5 contacts the inner surfaces of the housing 6 everywhere and also the electronic circuit 3 and its circuit board 2.

When temperature induced expansions subsequently occur in the encasement body 5, the encasement body 5 presses against the housing 6 from the inside, which housing can only co-expand within limits or not at all, which increases the pressure of the encasement body 5 upon the electronic circuit 3, which can damage the electronic circuit, in particular through tearing the circuit elements off from the circuit board 2, as a function of the direction, in which the pressure forces act.

In order to prevent this, the free spaces 7, which are visible best in the longitudinal cut of FIG. 2*a*, are provided between the largest portion of the outer circumferential surface of the encasement body 5 and the externally surrounding housing 6, into which free spaces the material of the encasement body can expand when the encasement body expands, so that the pressure against the electronic circuit 3 does not increase in the interior.

In the present case, the outer housing 6 is respectively a slender cylindrical housing with an open face on top and a closed face on the bottom, into which the encasement body 5, which is produced in an external encasement mold, is inserted from the top. In the interior of the encasement body 5, which is also cylindrical, the circuit board 2 extends in longitudinal direction of the encasement body, mostly a circuit board on whose one side or on whose both sides, the electronic elements of the circuit 3 are disposed and connected to one another.

In the present case, the circuit board 2 is T-shaped with a transversal arm in insertion direction 21 at the front end, at whose exterior surface, an electronic element is also disposed, in this case a chip 3'.

The free spaces 7 are generated by the encasement body 5 having a significantly smaller outer cross section than the inner cross section of the housing 6, but particular rises 14', e.g. semispherical or conical, thus singular rises protruding from said enveloping surfaces, distributed about the enveloping surface, as evident best from the partial sectional view of FIGS. 2*b* and 2*c*.

In this case, the rises 14*c* are conical rises that taper to a point, which are disposed in even rows along circumference lines. The total portion of the rises as a fraction of the enveloping surface, however, amounts to less than 10%, in particular less than 5%.

On the forward face in insertion direction, on the outer circumference, there are also either plural punctiform rises distributed over the circumference in 14', or an annular circumferential line shaped spacer ring 9 protruding in axial direction, so that a lower ring of the encasement body 5 is created in the center of the encasement body, and so that only the rises 14' or 9 contact the flat bottom in the interior of the housing 6 at said location. Preferably, the chip 3' disposed in the circuit is covered by a thin layer of the material of the encasement body 5.

The housing 6 comprises an exterior thread 22 on its outer circumference, which exterior thread extends over the entire length and which is used for fixating to a component in the vicinity, in particular through screwing into an inner thread provided therein and fixating with nuts.

At the upper originally open end of the housing 6, said housing is now closed by a plug connector, which is configured pot shaped, and which contacts the interior of the housing 6 tight with its enveloping surface, and which was glued there in particular during insertion.

The plug socket 13 comprises an outward oriented shoulder 16 at its rear free end, which shoulder contacts the free face of the housing 6.

Since the plug socket 13 was already connected to the circuit 3 during encasement and was inserted into the encasement mold together therewith, the encasement body 5 contacts the backside of the pot shaped plug socket 13 and has been glued together therewith during encasement, and in order to improve said gluing, the outer walls of the plug socket extend axially further forward beyond its rear face.

In the pot shaped interior of the front side of the plug socket 13, oriented outward with respect to the housing 6, the plug contacts for plugging in the opposite element are disposed as it is typical in the art.

Figure 3A:
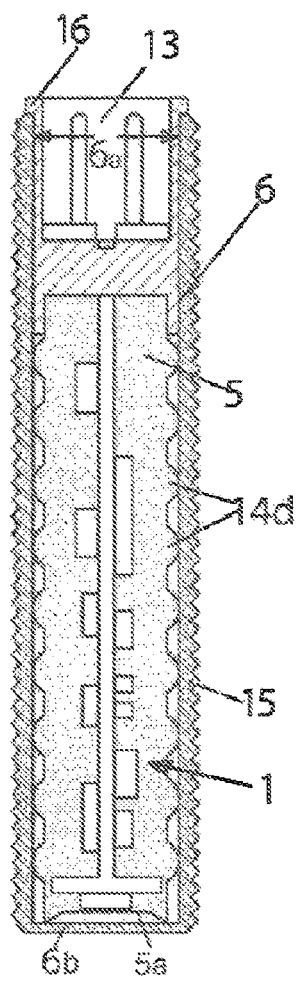
FIGS. 3(*a*)-(*c*) show a second embodiment of the encased component.
Figure 3B:
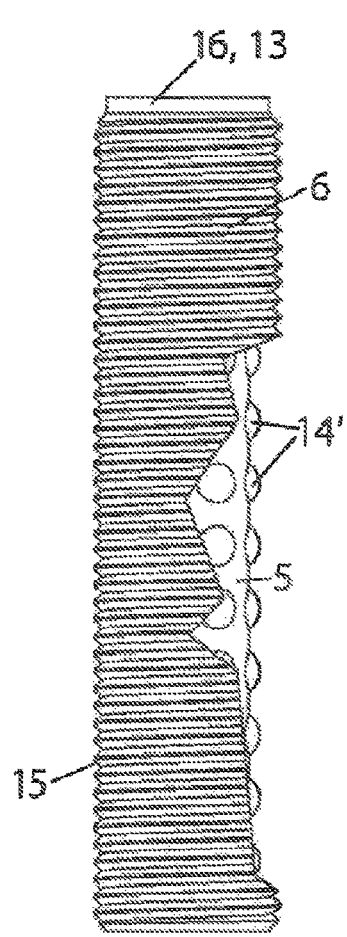
Figure 3C:
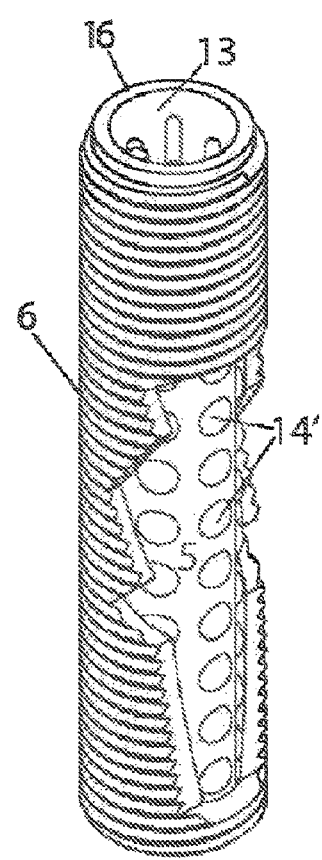

FIG. 3 shows a second embodiment, which differs from the embodiment of FIG. 2 in that the singular rises 14' comprise a rather semispherical cross section, and thus contact the inner surface of the housing 6 after insertion into the housing 6 with a larger surface than the tips of the conical rises in FIG. 2. This, however, makes inserting the encasement body slightly more difficult since the rises 14' can be compressed slightly less in radial direction due to the larger contact surface, than the pointed rises in FIG. 2; this yields e.g. a more stable support of the encasement body in the housing 6, with respect to shock loading in radial direction.

Figure 4B:
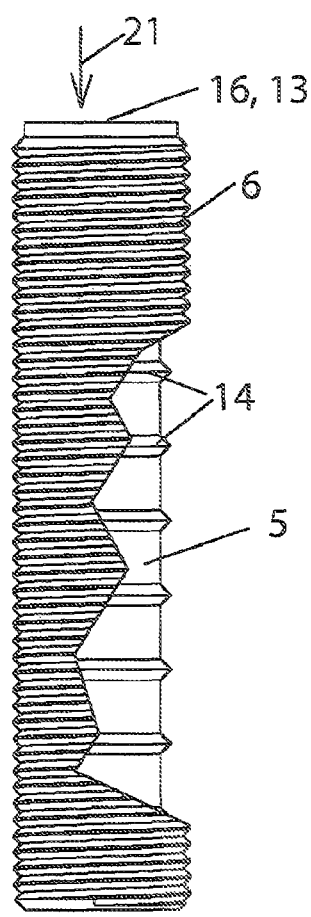
FIGS. 4(*a*)-(*c*) show a third embodiment of the encased component.
Figure 4A:
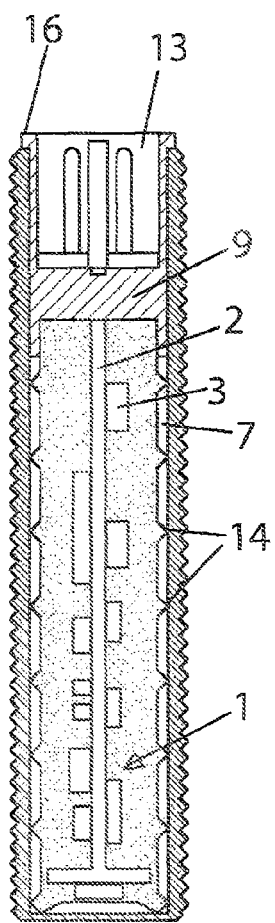
Figure 4C:
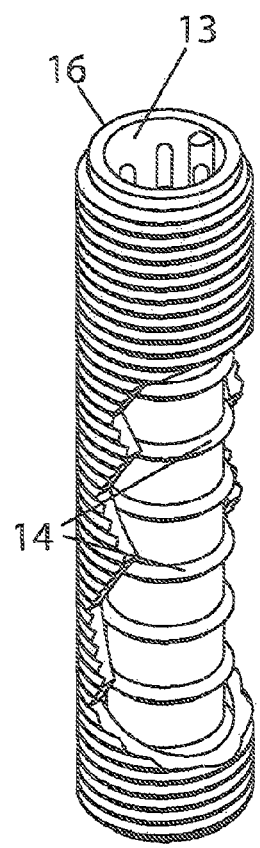

FIG. 4 shows an embodiment, in which the rises on the enveloping surface of the encasement body 5 are line shaped rises 14, which are offset in axial direction as radially circumferentially configured annular rises 14 and which are provided distributed over the length of the encasement body 5. The strip shaped rises 14 comprise a tapered triangular cross section.

In the transition portion between the enveloping surface and the lower front face of the encasement body, an annular circumferential line shaped spacer ring 9 protrudes diagonally outward and thus, preferably does not comprise a triangular, but preferably comprises a square cross section, so that its outer edges, on the one hand, contact the inner circumference of the housing 6, and, on the other hand, contact the bottom of the housing 6.

Since the line shaped rises 14 extend transversally to the insertion direction 21 of the encasement body 5 into the housing 6, they pose rather high resistance during insertion, but subsequently they act as an additional barrier against the penetration of moisture towards the bottom of the housing 6 in addition to the sealing arrangement of a housing cover in the open side of the housing 6, if the sealing of the housing cover provided e.g. in the form of a plug socket 13 should fail.

This is not the case in the configurations of FIGS. 5 and 6, however, thus inserting goes with less resistance, since herein the strip shaped rises 14 are disposed in longitudinal direction 10 on the enveloping surface of the encasement body 5 and extend along its entire length. The distance of the face from the bottom of the housing 6 is in turn assured through respective punctiform or annular circumferential rises 14', 14.

Such strip shaped rises 14 extending along the longitudinal direction 10 of the enveloping surface can be obtained in the simplest manner, when the cross section of the encasement body 5 has a polygonal shape which is sized, so that its outer edges contact the cylindrical inner circumference of the housing 6 after insertion.

Depending on the size of the free spaces 7 to be provided, the number of polygon traverses is selected, and the polygon lines are straight, or when the free spaces shall become larger, they are bent concave as illustrated in FIG. 5a for an octagonal cross section of the encasement body 5.

As illustrated in the comparison with FIG. 6a, the free spaces 7 are already much smaller in a straight octagonal polygonal cross section.

The free spaces of the octagonal polygonal cross section of the encasement body 5 of FIG. 5a are rather comparable with respect to size to the hexagonal cross section shape with straight outer surfaces illustrated in FIG. 6c.

By comparison FIG. 6b shows a solution, in which the encasement body 5 is a square body in cross section, which generates rather large free spaces towards the housing 6, wherein, however, also the support against vibrations in radial direction is smaller.

Accordingly, the selection of the polygon shape of the encasement body 5 and also of the straight or concave shape of the outer surfaces of the encasement body 5 is determined as a function of the subsequent application of the sensor.

Figure 7:
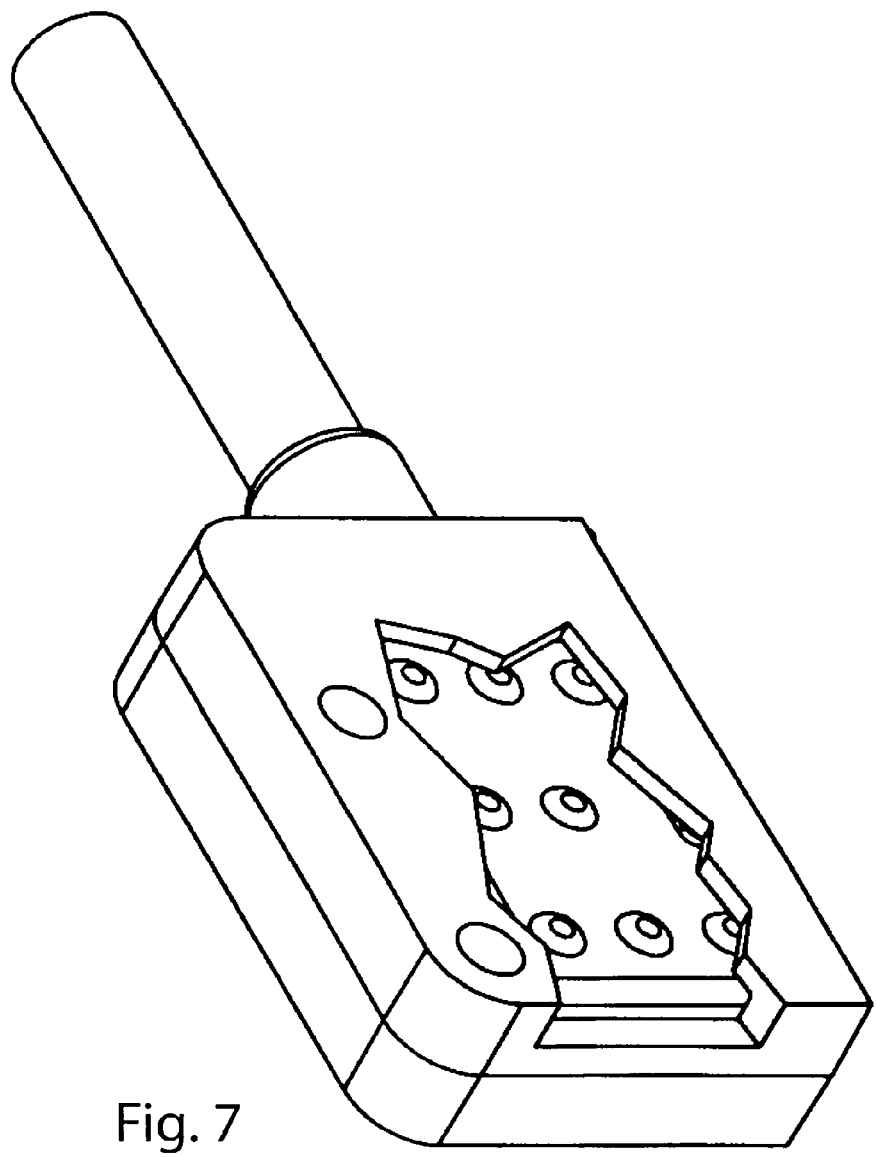
FIG. 7 shows a different housing shape.

FIG. 7 is furthermore an example for neither the housing nor the encasement body having to comprise a rotation symmetrical cross section, but this is also applicable to all other forms of sensors and housings.

REFERENCE NUMERALS AND DESIGNATIONS

1 sensors
2 circuit board
3 electronic circuit
3' chip
4 encasement mold
5 encasement body
5a front face
6 housing
6a opening
6b bottom
7 free space
8 shoulder
9 spacer ring
10 longitudinal direction
11 cable
11' cable jacket
11a, b conductor
12 pass-through
13 plug-in connector
14 strip shaped rise
14' singular rise
15 exterior thread
16 shoulder
17 ring groove
18 O-ring
19 glue joint
19' glue
20 compression
21 insertion direction
22 exterior thread

The invention claimed is:

1. An encased electronic component, said component comprising:
    an electronic sensor (1) with at least one electronic circuit (3) arranged on at least one circuit board (2), received in and enclosed by an encasement body (5), wherein the encasement body (5) is received in a housing (6) in a form-locked manner, and sufficient free spaces (7) are provided between the encasement body (5) and the housing (6) for compensating temperature expansions of the housing (6) or of the encasement body (5);

wherein the encasement body (5) comprises strip shaped rises (14), in the longitudinal direction of the encasement body, or singular rises, on the outer circumference of the encasement body.

2. The component according to claim 1, wherein the housing (6) is configured open only on one side, and is configured in particular integrally pot shaped.

3. The component according to claim 1, wherein a housing cover (9) is integrally molded at the encasement body (5).

4. The component according to claim 1, wherein a plug-in connector (13) is integrally molded with the encasement body (5).

5. The component according to claim 1, wherein the encasement body (5) is comprised of light permeable material.

6. The component according to claim 1, wherein the housing (6) is made of metal or plastic.

7. The component according to claim 1, wherein the housing (6) comprises a cylindrical contour on an outside.

8. The component according to claim 1, wherein a forward face (5a) in insertion direction of the encasement body (5) is at least partially offset from a bottom (6b) of the pot-shaped housing by a spacer element.

9. The component according to claim 1, wherein the encasement body (5) comprises an outward protruding shoulder (16) at its rearward protruding end in insertion direction (21), through which it contacts an opening (6a) of the housing.

10. The component according to claim 1, wherein a shoulder (16) is configured at a housing cover (9) or at a plug connector (13), which are integrally cast on one side of the encasement body (5).

11. An encased electronic component, comprising:
  an electronic sensor (1) with at least one electronic circuit (3), arranged on at least one circuit board (2), enclosed by an encasement body (5), wherein the encasement body (5) is received in the housing (6) in a form locked manner, and sufficient free spaces (7) are provided between the encasement body (5) and the housing (6) for compensating temperature expansions of the housing (6) or of the encasement body (5);
  wherein a plug-in connector (13) is integrally molded with the encasement body (5).

* * * * *